United States Patent
Takita et al.

[11] Patent Number: 6,147,421
[45] Date of Patent: Nov. 14, 2000

[54] PLATFORM POSITIONABLE IN AT LEAST THREE DEGREES OF FREEDOM BY INTERACTION WITH COILS

[75] Inventors: Mark K. Takita, Palo Alto; W. Thomas Novak, Hillsborough; Andrew J. Hazelton, San Carlos, all of Calif.

[73] Assignee: Nikon Corporation, Tokyo, Japan

[21] Appl. No.: 09/192,637

[22] Filed: Nov. 16, 1998

[51] Int. Cl.[7] .................................................. H02K 41/00
[52] U.S. Cl. ................................................ 310/12; 318/135
[58] Field of Search .............................. 310/12; 33/1 M; 74/471; 108/137, 138; 29/721, 760, 785; 318/38, 135

[56] References Cited

U.S. PATENT DOCUMENTS

| | | | |
|---|---|---|---|
| Re. 27,289 | 2/1972 | Sawyer | 318/38 |
| Re. 27,436 | 7/1972 | Sawyer | 318/135 X |
| 3,851,196 | 11/1974 | Hinds | 310/12 |
| 3,878,411 | 4/1975 | Nocito et al. | 310/12 |
| 4,049,983 | 9/1977 | Attwood et al. | 310/13 |
| 4,151,447 | 4/1979 | von der Heide et al. | 318/135 |
| 4,485,339 | 11/1984 | Trost | 318/640 |
| 4,535,278 | 8/1985 | Asakawa | 318/687 |
| 4,555,650 | 11/1985 | Asakawa | 318/135 |
| 4,626,749 | 12/1986 | Asakawa | 318/135 |
| 4,654,571 | 3/1987 | Hinds | 318/687 |
| 4,705,956 | 11/1987 | Ward | 250/492.2 |
| 4,706,007 | 11/1987 | Nagasaka | 318/687 |
| 4,742,286 | 5/1988 | Phillips | 318/640 |
| 4,786,832 | 11/1988 | Nakagawa et al. | 310/12 |
| 4,952,858 | 8/1990 | Galburt | 318/647 |
| 4,958,115 | 9/1990 | Miller | 318/662 |
| 5,015,622 | 5/1991 | Ward et al. | 310/12 X |
| 5,126,648 | 6/1992 | Jacobs | 318/640 |
| 5,196,745 | 3/1993 | Trumper | 310/12 |
| 5,208,497 | 5/1993 | Ishii et al. | 310/12 |
| 5,294,854 | 3/1994 | Trumper | 310/90.5 |
| 5,309,049 | 5/1994 | Kawada et al. | 310/12 |
| 5,334,892 | 8/1994 | Chitayat | 310/12 |
| 5,352,946 | 10/1994 | Hoffman et al. | 310/12 |
| 5,360,470 | 11/1994 | Ono et al. | 104/284 |
| 5,477,304 | 12/1995 | Nishi | 355/53 |
| 5,504,407 | 4/1996 | Wakui et al. | 318/568.17 |
| 5,528,118 | 6/1996 | Lee | 318/568.17 |
| 5,574,556 | 11/1996 | Mori et al. | 356/244 |
| 5,623,853 | 4/1997 | Novak et al. | 74/490.09 |
| 5,666,038 | 9/1997 | Ohishi | 318/625 |
| 5,715,037 | 2/1998 | Saiki et al. | 356/401 X |
| 5,773,837 | 6/1998 | Nakasuji | 250/412.23 |

FOREIGN PATENT DOCUMENTS

| | | |
|---|---|---|
| 62-100161 | 5/1987 | Japan . |
| 2-168846 | 6/1990 | Japan . |
| 3-178747 | 8/1991 | Japan . |
| 4-125055 | 4/1992 | Japan . |
| 7-060581 | 3/1995 | Japan . |
| 7-131966 | 5/1995 | Japan . |

OTHER PUBLICATIONS

Trumper et al. "Design and Analysis Framework for Linear Permanent Magnet Machines" (1994) *IEEE* 216–223 (month unknown).

Trumber et al "Magnet Aarrays for Synchronous Machines" (1993) *IEEE* 9–18 (month unknown).

*Primary Examiner*—Nestor Ramirez
*Assistant Examiner*—Judson H. Jones
*Attorney, Agent, or Firm*—Morrison & Foerster LLP

[57] ABSTRACT

The invention comprises a platform positionable in at least three degrees of freedom at least partly by interaction with coils. The platform includes a support member having a surface. Magnets are attached to the surface and part of a magnet bearing is attached to the support member. Inner and outer platforms are coupled to each other by magnet bearings and interact with coils to position the inner platform in six degrees of freedom. The invention may be particularly useful in precise positioning of semiconductor wafers and materials during photolithography and other processing.

24 Claims, 7 Drawing Sheets

PLATFORM POSITIONABLE IN AT LEAST THREE DEGREES OF FREEDOM BY INTERACTION WITH COILS

TECHNICAL FIELD

The invention relates generally to electric motors and, more particularly, to two-dimensional motors.

BACKGROUND ART

Electric motors are used in a variety of electrical equipment. For example, linear electric motors produce electrical power propelling an armature in one dimension. Wafer stages utilize linear electric motors to position a wafer during photolithography and other semiconductor processing.

A typical one-dimensional linear electric motor has a magnet track with pairs of opposing magnets facing each other. (Copending U.S. Ser. No. 09/059,056, entitled "Linear Motor Having Polygonal-Shaped Coil Unit" filed on Apr. 10, 1998, by Hazelton et al. (Attorney Docket No. M-5107US) discusses one-dimensional linear electric motors and is incorporated herein by reference in its entirety.) Within spaces between the pairs of opposing magnets, an armature moves. The armature has windings of a conductor which are connected to an electrical current. When the electrical current is turned on, the electric current interacts with the magnetic fields of the magnet pairs to exert force on the armature, causing the armature to move. When the armature is attached to a wafer stage, the wafer stage experiences the same force as and moves in concert with the armature.

In a multiphase motor, the armature has various windings grouped into phases. The phase groups are selectively pulsed with electric current to create a more efficient motor. As the armature moves within the magnet track as a first group of coils is pulsed, the first group moves out of its optimal position between the pairs of magnets. Then, it becomes more efficient to pulse a second group of windings. More phase groups are theoretically more efficient since a more even application of force and utilization of power input is maintained. However, each additional phase group complicates a timing of the pulses to the various phase groups. Presently, three-phase motors and armatures have gained favor in balancing these considerations.

Linear two-dimensional motors are also used in manufacturing. (U.S. Pat. No. 4,654,571, entitled "Single Plane Orthogonally Moveable Drive System," issued to Hinds on Mar. 31, 1987, U.S. Pat. No. 4,535,278, entitled "Two-Dimensional Precise Positioning Device for Use in a Semiconductor Manufacturing Apparatus," issued to Asakawa on Aug. 13, 1985 and copending U.S. Ser. No. 09/192,813, entitled "Electric Motors and Positioning Devices Having Moving Magnet Arrays and Six Degrees of Freedom" filed on Nov. 16, 1998, by Hazelton et al. discuss two-dimensional linear electric motors and are incorporated herein by reference in their entireties.) The motors are two-dimensional in that they have two-dimensional arrays of magnets and armatures instead of magnet tracks and one-dimensional armatures. However, the magnet arrays and two-dimensional armatures may move with respect to each other in more than two dimensions depending upon the design. Conventional two-dimensional linear motors typically have an array of magnets and an armature having one or more coils on one side of the array of magnets.

When attached to part of a two-dimensional linear motor, a platform can be moved in two or more dimensions by the motor. For example, a wafer stage in semiconductor processing equipment may be attached to an armature or magnet array of a two-dimensional motor, and the two-dimensional motor would control positioning of the wafer stage.

Electric motors are also used to provide motion of platforms or stages in six degrees of freedom, three translational and three rotational. (Richard P. Feynman, T. Leighton, and M. Sands, *The Feynman Lectures on Physics*, Addison-Wesley, 1962, discusses translational and rotational motion and degrees of freedom and is incorporated by reference herein in its entirety.) Unfortunately, many designs obtain six degrees of freedom by essentially stacking one dimensional motors which move only in two dimensions within a plane. (U.S. Pat. No. 5,623,853, entitled "Precision Motion Stage with Single Guide Beam and Follower Stage" issued to Novak et al. on Apr. 29, 1997, discusses examples of such stacked arrangements and is incorporated herein by reference in its entirety.) For example, a stage may be propelled back and forth in one dimension under the control of linear electric motors. The linear electric motors are part of a holder which holds the stage. In turn, a second holder holds that entire holder and stage arrangement via joint connections and propels it back and forth in a second dimension by another set of linear electric motors. Additional degrees of motion may be provided by additional electric motors which are attached to these holders.

These types of stacked arrangements have a few drawbacks. Each additional holder enabling more degrees of freedom also adds mass requiring additional power for the electric motors to move the stage. Also, the complicated joint connections degrade accuracy of positioning of the stage and build-in resonant frequencies.

An alternative design is discussed in U.S. Pat. No. 5,196,745, "Magnet Positioning Device", issued to Trumper on Mar. 23, 1993 ("Trumper") which is incorporated by reference herein in its entirety. Trumper describes a planar motor comprising several linear motors formed between two planes. On the first plane, halves of conventional one dimensional magnet tracks used in one dimensional electric motors are placed about the plane. On the second plane, coils similar to those of one dimensional linear electric motors, are placed on areas on the second plane corresponding with the halves of the magnet track on the first plane. By commutating the coils on the second plane, Trumper achieves six degrees of freedom. However, since the Trumper design is based on a one dimensional linear electric motor design, the coils and the corresponding halves of magnet tracks must remain in close proximity to each other, thereby limiting the range of motion.

What is needed is a two dimensional electric motor that obviates the need for stacked stages and has a broader range of motion than that of the Trumper design. By eliminating the stacked stages, motor power requirements for motion would be lower. Additionally, fewer moving parts results in higher resonant frequencies and greater stability of motion. A wider range of motion permits greater choice of positions.

SUMMARY OF THE INVENTION

The invention comprises a platform positionable in at least three degrees of freedom at least partly by interaction with coils. The platform includes a support member having a surface. Magnets are attached to the surface and part of a magnet bearing is attached to the support member.

In some embodiments, the invention features an apparatus including an object, magnets, and an array of armatures. The object includes a surface extending in a first direction and in a second direction. The magnets are coupled to the object such that the magnets may move with respect to the object in a third direction about the first direction, in a fourth direction about the second direction, and in a fifth direction. The array of armatures interact with the magnets to cause the magnets to move in at least one of the third direction, the fourth direction, and the fifth direction.

In some embodiments, the invention also features a device including a member, levitation magnets, a magnet bearing and a planar array of coils. The member has a planar surface extending in first and second directions with an array of checker magnets periodically distributed on the surface. The magnet bearing couples the levitation magnets to the member. The coupling permits the levitation magnets to move with respect to the member in a third direction about the first direction, in a fourth direction about the second direction, and in a fifth direction. The planar array of coils interacts with the array of checker magnets and the levitaton magnets to move the member in at least one of the first, second, third, fourth, or fifth directions or a sixth direction about the fifth direction. In this way, the member and the planar array of coils are capable of moving with respect to each other in six degrees of freedom.

In some embodiments, the invention includes inner and outer platforms each having either periodically distributed checker magnets or levitation magnets. The inner platform resides in an aperture formed by the outer platform. For example, the checker magnets may be attached to the outer platform, and the levitation magnets may be attached to the inner platform. The inner and outer platforms are coupled by magnet bearings. For planar platforms and coil arrays, the checker magnets interact with currents in the array of armatures to provide motion of the outer platform in the two directions parallel to a plane and about a direction perpendicular to the plane. The levitation magnets interact with the currents to provide motion in the perpendicular direction and about the two directions in the plane. The magnet bearings are stiff in the two planar directions but relatively not stiff in the perpendicular direction. In this way, the inner platform can move in six degrees of freedom.

The invention has advantages over conventional platforms, apparatuses and devices. By decoupling degrees of freedom to correspond to separate platforms and coupling the platforms with magnet bearings, much more stable motion of the inner platform can be achieved. In addition, the invention's inner platform range of movement in six degrees of freedom is superior to conventional designs.

The invention should be particularly useful in semiconductor processing equipment. When adapted to hold a workpiece such as a semiconductor wafer, the inner platform can accurately position the workpiece in six degrees of freedom. Photolithography machines are examples of semiconductor processing equipment that can utilize the invention.

These and other objects, features, and advantages of the invention will become readily apparent to those skilled the art upon a study of the following drawings and a reading of the description of the invention below.

DESCRIPTION OF THE INVENTION

The invention comprises a platform positionable in at least three degrees of freedom at least partly by interaction with coils. Magnets are attached to the platforms and interact with coils to provide motion in the three degrees of freedom. In some embodiments, the invention has inner and outer platforms coupled by magnet bearings. Then, the inner platform is capable of relative motion with respect to the coils in six degrees of freedom.

The invention has advantages over conventional platforms, apparatuses and devices. By decoupling degrees of freedom to correspond to separate platforms and coupling the platforms with magnet bearings, much more stable motion of the inner platform can be achieved. In addition, the invention's inner platform range of movement in six degrees of freedom is superior to conventional designs.

For background material, the reader is directed to the following standard textbooks all of which are incorporated by reference herein in their entireties: *Permanent-Magnet DC Linear Motors*, A. Basak, Clarendon Press, 1996; R. P. Feynman, T. Leighton and M. Sands, *Feynman Lectures on Physics*, Addison-Wesley, 1962; *Fundamentals of Physics*, Second Edition, Extended Version, Revised Printing, David Halliday and Robert Resnick, John Wiley & Sons, 1986; *Brushless Permanent-Magnet Motor Design*, D. C. Hanselman, McGraw-Hill, 1994; *Design of Brushless Permanent-Magnet Motors*, J. R. Hendershot, Jr. and T. J. E. Miller, Magna Physics Publishing and Clarendon Press, 1994; E. M. Purcell, *Electricity and Magnetism*, McGraw-Hill, 1965. Additional background material may be found in U.S. Pat. No. 5,196,745, "Magnet Positioning Device", issued to Trumper on Mar. 23, 1993 (Trumper), cited in the background section, U.S. Pat. No. 4,535,278 "Two-Dimensional Precise Positioning Device for Use in a Semiconductor Manufacturing Apparatus", issued to Asakawa on Aug. 13, 1985 ("Asakawa"), and U.S. Pat. No. 4,654,571, "Single Plane Orthogonally Moveable Drive System" issued to Walter E. Hinds on Mar. 31, 1987 ("Hinds") all of which are incorporated by reference herein in their entirety.

Figure 1:
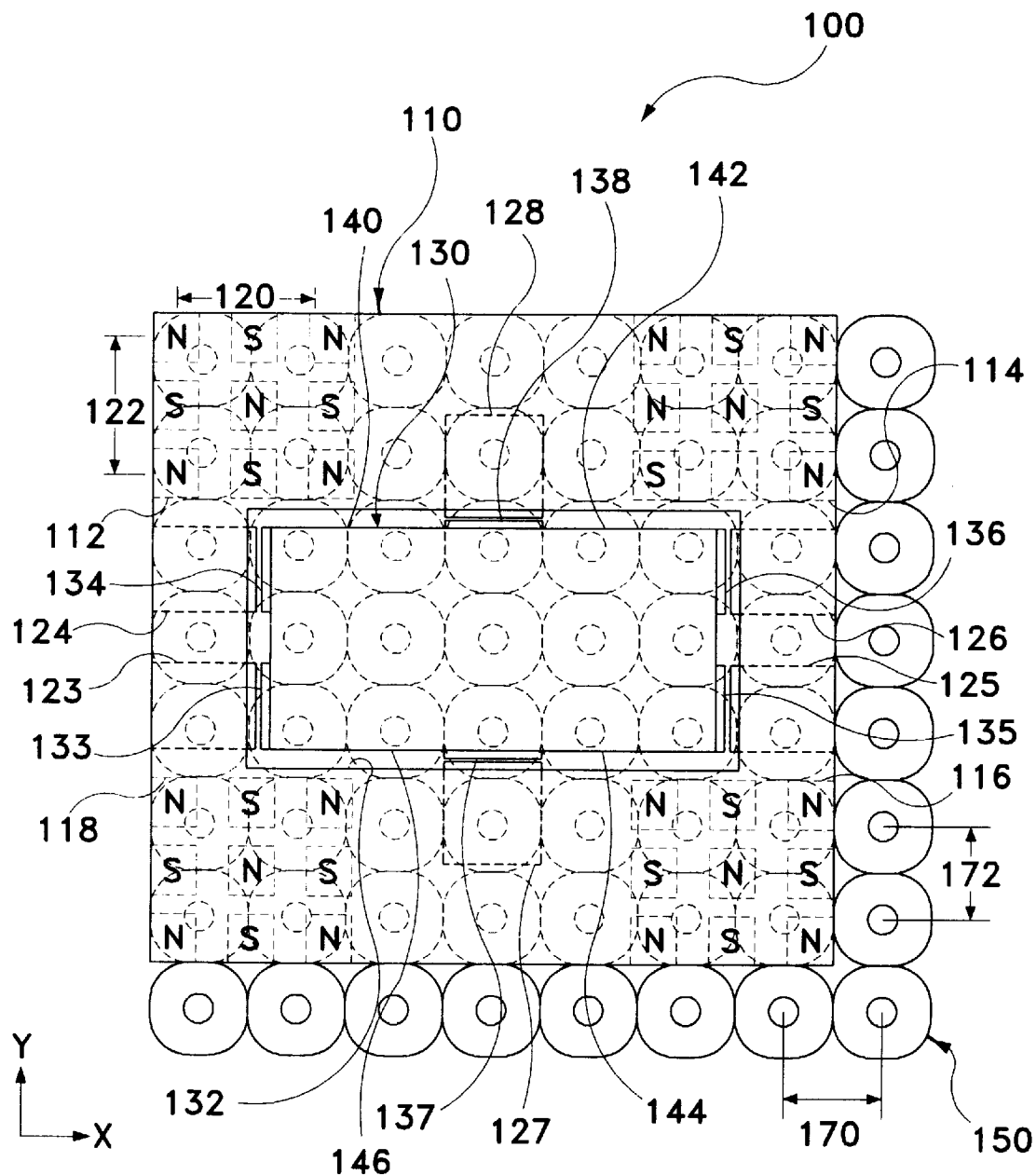
FIG. 1 is a top plan view of an apparatus in accordance with the present invention.

FIG. 1 is a top plan view of an apparatus 100 capable of positioning a work piece in six degrees of freedom. The apparatus 100 has an outer platform 110, an inner platform 130, and a coil array 150. In the embodiment shown in FIG. 1, the current applied to the coils of the coil array 150 interacts with magnets on the outer platform 110 and the inner platform 130. This interaction permits the inner platform 130 to be positioned with respect to the coil array 150 in six degrees of freedom. These six degrees of freedom include X and Y directions, a Z direction out of the plane of FIG. 1, and three rotational degrees of freedom about the X, Y, and Z directions. (For background information on translational and rotational degrees of freedom, the reader is directed to the *Feynman Lectures on Physics* by R. P. Feynman, et al. referenced above.)

In some embodiments, the outer platform 110 floats on an air cushion (not shown) in a manner well-known to those skilled in the art. A conventional air cushion arrangement is described in Hinds referenced-above. When the air cushion supports the outer platform 110, currents applied to the array of coils 150 still interact with magnets on the outer platform 110 to further position the outer platform 110.

The outer platform 110 has one or more arrays of magnets periodically distributed on a surface of the platform. In the embodiment in FIG. 1, the outer platform 110 has four sections 112, 114, 116, and 118 comprising arrays of periodically distributed magnets. Within each section, 112, 114, 116, and 118, the magnets are periodically distributed with alternating polarities. On diagonals of the X and Y directions, the magnets have a same polarity. For example, each of the sections 112, 114, 116, and 118 have two diagonals of three north polarity magnets and two south polarity magnets.

The periods in the X and Y directions for the magnets in the sections 112, 114, 116, and 118 are related to periods of the coil array 150 in the X and Y directions. In the embodiment shown in FIG. 1, in the X direction, a coil period 170 is approximately three-fourths a magnet period 120. Similarly, in the Y direction, a coil period 172 is approximately three-fourths a magnet period 122. As will be described below with reference to FIG. 3, these period relationships permit the outer platform 110 to move with respect to the coil array 150 in the X and Y directions and also about the Z direction.

The outer platform 110 in FIG. 1 defines an aperture 132 around which six pieces of magnet bearings 123, 124, 125, 126, 127, 128 are non-colinearly disposed. Magnet bearing pieces 123, 124 and magnet bearing pieces 125, 126 are on opposite sides of the aperture 132 in the X direction. Magnet bearing piece 127 and magnet bearing piece 128 are also on opposite sides of the aperture 132 in the Y direction. The inner platform 130 resides within the aperture 132. The magnet bearing pieces 123, 124, 125, 126, 127, and 128 are paired with corresponding magnet bearing pieces 133, 134, 135, 136, 137, and 138 on the inner platform 130. The magnet bearing pieces and corresponding magnet bearing pieces form magnet bearings which are stiff in the X and Y directions, but not stiff in the Z direction.

The inner platform 130 has levitation magnets 140, 142, 144, and 146, which interact with the coil array 150. The inner platform 130 moves in the Z direction relative to the outer platform 110 depending upon its interaction with the currents applied to the coil array 150. Since different parts of the inner platform 130 may be at different heights depending upon the interaction of the magnets 140, 142, 144, and 146 with the coil array 150, the interaction provides motion of the inner platform 130 in the Z direction and about the X and Y directions. In other words, the inner platform 130 is free to move in three degrees of freedom with respect to the outer platform 110. As will be readily appreciated by those skilled in the art, although the embodiment 130 has four levitation magnets 140, 142, 144, and 146, only three levitation magnets are required to provide motion in the Z direction and about the X and Y directions.

An overall effect of the interactions and motions of the platforms 110 and 130 and the coil array 150, provide motion of the inner platform 130 in six degrees of freedom. The outer platform 110 moves in the X and Y directions and about the Z direction, while the inner platform 130 moves in the Z direction and about the X and Y directions with respect to the outer platform 110. The magnet bearings coupling the outer platform 110 to the inner platform 130 are stiff in the X and Y directions, but not stiff in the Z direction. Magnet bearings, such as those formed by the pairings of magnet bearing pieces 123 and 133, and 118 and 128, provide a much higher degree of stiffness in the X and Y directions than stacked stages of conventional apparatuses. Ratios of stiffness in the X and Y directions with respect to stiffness in the Z direction of greater than 10,000 to 1 can typically be achieved with magnetic bearings.

The apparatus 100 of FIG. 1 has significant advantages over conventional positioning devices. First, the platforms 110 and 130 are not restricted in their range of movement with respect to the coil array 150. Although the platforms 110 and 130 must remain over the coil array 150, they do not require any particular position in the X and Y directions. Their position in the Z direction is limited only by the amount of power a user is willing to input into the coils in the coil array 150 and the strength of the magnets in the platforms 110 and 130. Second, the arrangement of the platforms 110 and 130 coupled by magnetic bearings is much more stable than conventional designs with stacked stages and joints connecting the stages. The embodiment 100 of the invention can more precisely position work pieces on the inner platform 130 than conventional devices.

Figure 2:
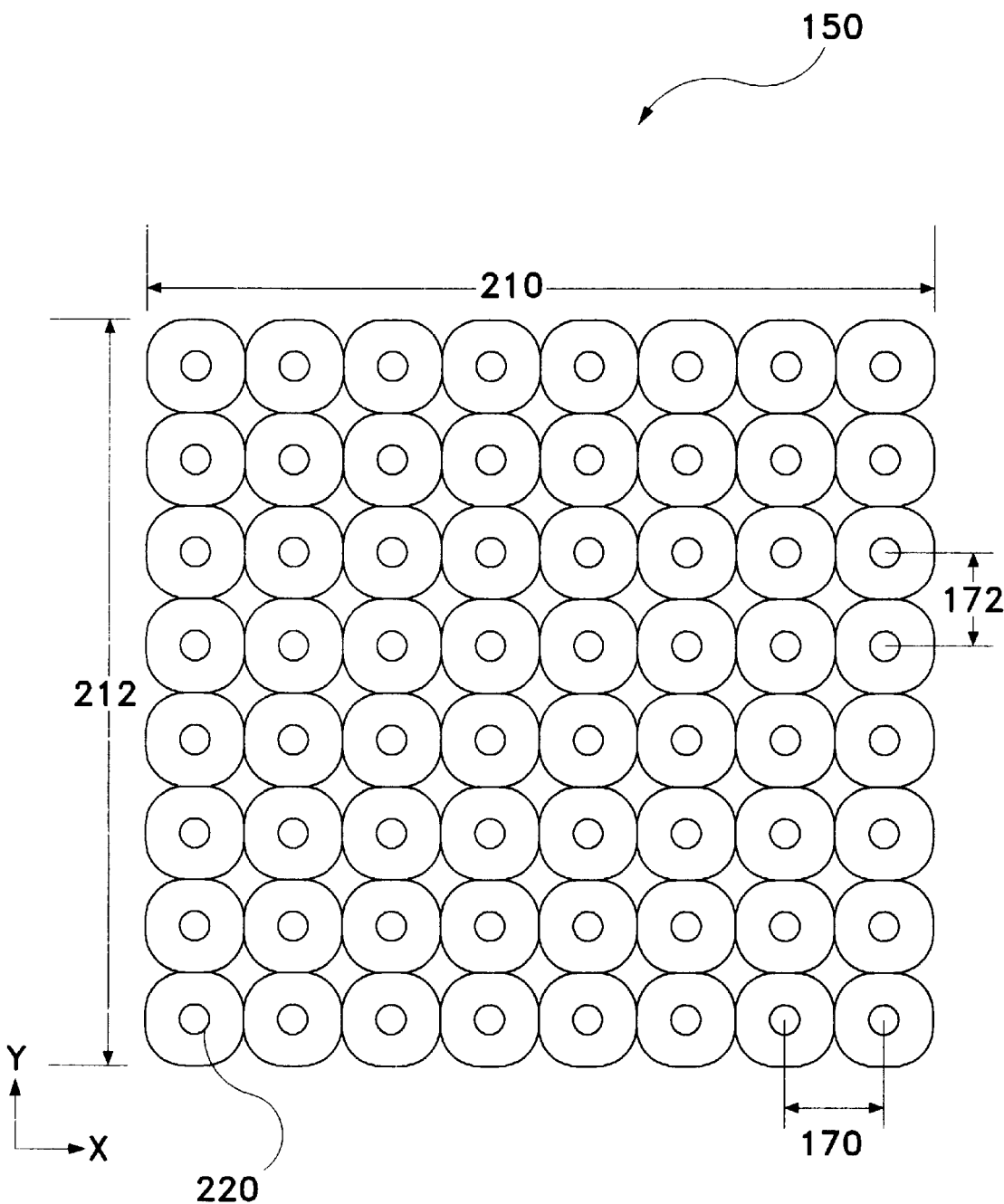
FIG. 2 is a top plan view of a coil array of the apparatus shown in FIG. 1.

FIG. 2 is a top plan view of the coil array 150 used in the positioning apparatus 100 of the invention. The X and Y coil periods 170 and 172 discussed with reference to FIG. 1 may be unequal. Similarly, coil array widths 210 in the X direction and 212 in the Y direction may also be unequal. Individual coils in the coil array 150 may be of approximately the same size and shape. In some embodiments, centers of the individual coil arrays, such as center 220, do not contain iron or any magnetically permeable substance. The absence of iron or other magnetically permeable substance in the center 220 prevents cogging of the motion of the outer platform 110 in the X and Y directions. The coils in the coil array 150 are commutated to provide motion of the outer platform 110 in the X and Y directions and about the Z direction by interacting with the periodically distributed magnets in the sections 112, 114, 116, and 118 of the outer platform 110.

Figure 3:
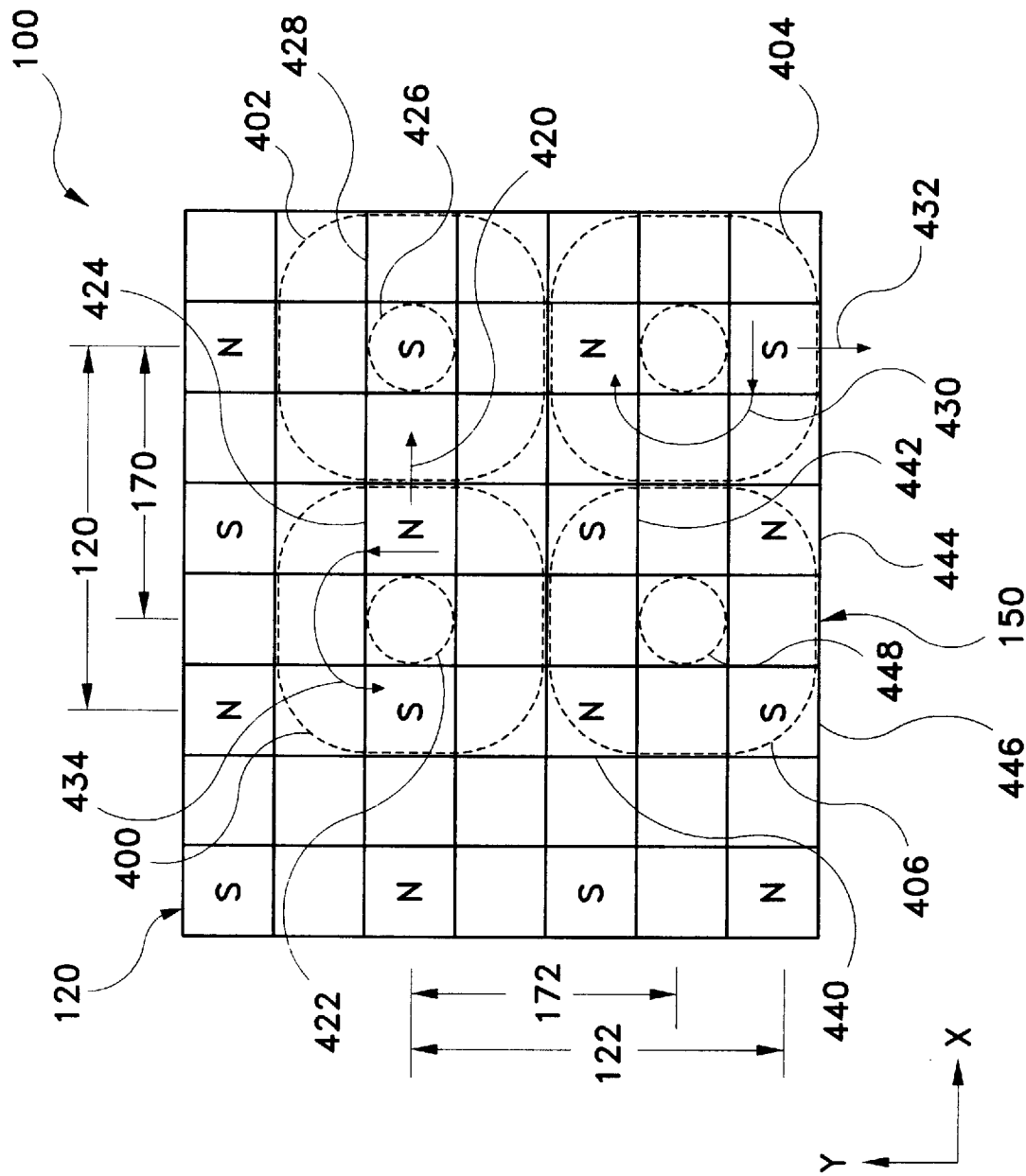
FIG. 3 is a schematic view of a section of the apparatus of FIG. 1.

FIG. 3 is a schematic view of a section of the apparatus 100 of FIG. 1 illustrating a portion of a subarray of the magnet array 120 and a set of four coils 400, 402, 404, and 406 of the coil array 150. The coils of the coil array has a period 170 in the X direction, approximately equaling three-fourths of magnet period 120 in the X direction. Similarly, the coils of the coil array has a period 172 in the Y direction, approximately equaling three-fourths of magnet period 122 in the X direction.

By appropriately commutating currents flowing in the coils 400, 402, 404, and 406, the coil array 150 is caused to move with respect to the magnet array 120. For example, in the position shown in FIG. 3, a counter-clockwise current applied to the coil 400 will generate a force on the coil array 150 in direction 420.

In a two-phase commutation scheme in the direction 420, the coils 400 and 402 may be commutated. For example, in the position shown in FIG. 3, the current in the counter-clockwise direction through the coil 400 is at a maximum while the coil 402 has no current flowing through it. As the coil 400 moves in the direction 420 relative to the magnet array 420 and the center 422 of the coil 400 approaches the next magnetic pole 424, the counter-clockwise current through the coil 400 approaches zero. As the coil 400 moves in direction 420, the coil 402 also moves in the direction 420 and its center 426 moves to area 428.

To maintain the force in the direction 420, the current in the coil 402 is commutated to flow in a counter-clockwise direction 434. The current in the coil 402 increases sinusoidally to its maximum. When the center 426 of coil 402 coincides with the area 428, the current in the coil 402 will be as its maximum.

Similarly, current can be commutated to flow in a clockwise direction 430 about the coil 404 to exert a force on the coil array 150 in a direction 432. As in the movement in the direction 420, the coils 402 and 404 may be commutated in the same fashion as the coils 400 and 402 to provide a continuous force in the direction 432. As with the coils 400 and 402, the commutation of the coils 402 and 404 is a two phase commutation.

Because magnets 440, 442, 444, and 446 are symmetrically positioned about its center 448, the magnets 440, 442, 444, and 446 create canceling forces upon the coil 406 provided the coil 406 is symmetric about its center 448. Thus, unlike the other three coils 400, 402, and 404, the coil 406 cannot generate a force upon the outer platform coil array 150 in the position shown in FIG. 3. In this position, coil 406 is not energized.

Only a few examples of commutation have been described. Clearly, as will be appreciated by those skilled in the art, many other commutations may be applied to the coils 400, 402, 404, 406 and the other coils in the coil array 150 to achieve motion in X and Y directions. By providing at least two sets of four coils and by simultaneously generating forces in both X and Y directions (directions 420 and 432), the apparatus 100 generates torque on the coil array 150 with respect to the magnet array 120, about the Z axis extending from the page of FIG. 3.

Figure 4A:
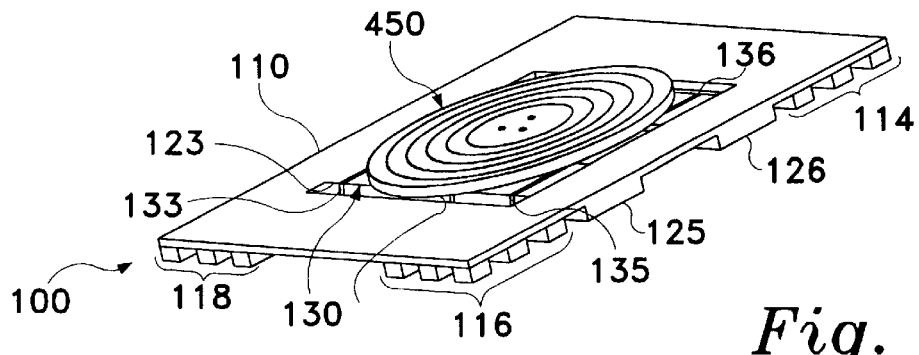
FIGS. 4A–4C top perspective, bottom perspective and bottom plan views, respectively, of the inner and outer platforms of the apparatus of FIG. 1.
Figure 4B:
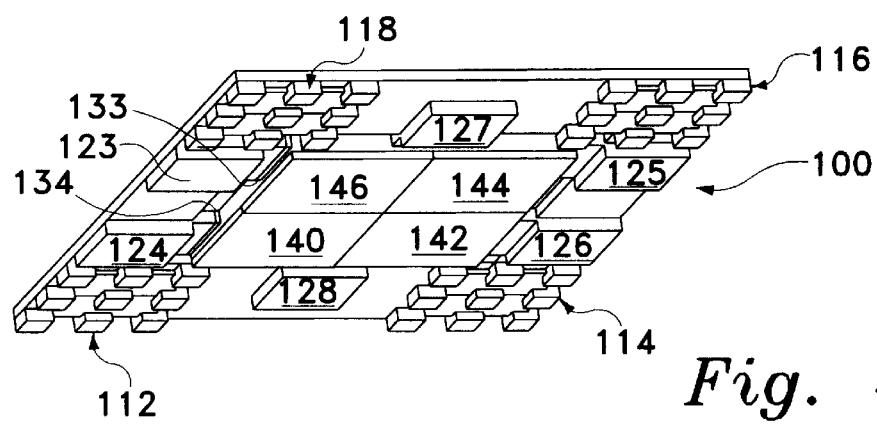
Figure 4C:
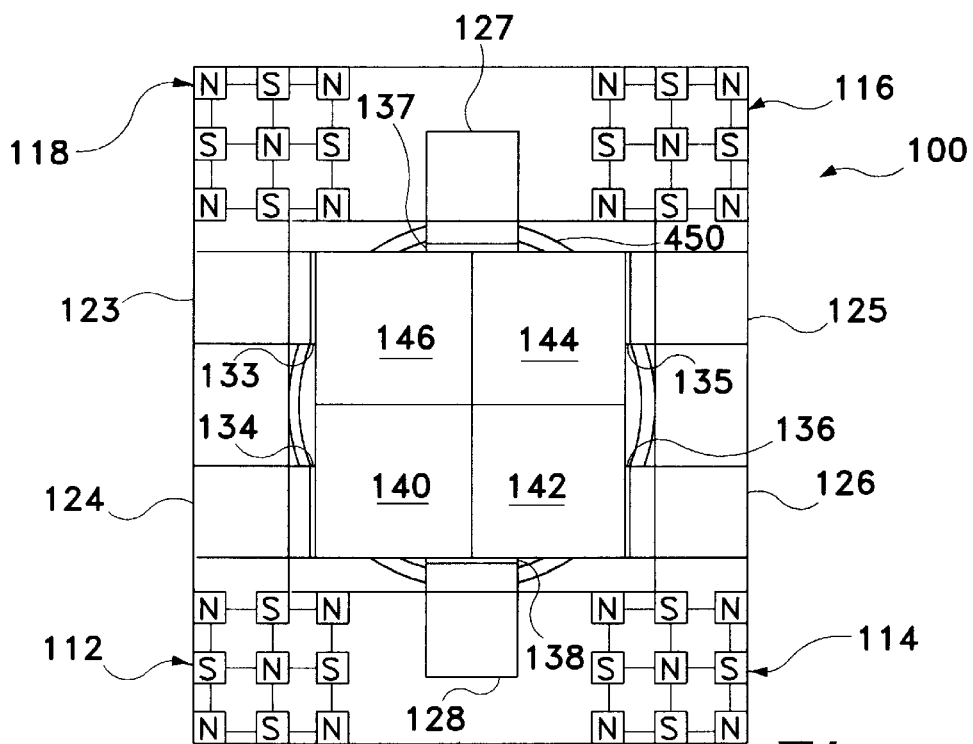

FIGS. 4A–4C show various views of the outer platform 110 and the inner platform 130 attached to a wafer chuck 450. FIG. 4A shows a top perspective view of an arrangement of the wafer chuck 450 attached to the inner platform 130 which is disposed within the aperture 132 of the outer platform 110. The wafer chuck 450 could easily be any other type of surface adapted to hold a particular work piece.

FIGS. 4B and 4C are bottom perspective and bottom plan views, respectively, of the arrangement of FIG. 4A. In the embodiment shown, the sections 112, 114, 116, and 118 are positioned at corners of the outer platform 110. The levitation or support magnets 140, 142, 144, and 146 are part of the inner platform 130. In the embodiment shown, the levitation magnets 140, 142, 144, and 146 are juxtaposed next to each other. There are no restrictions on the polarities of the levitation magnets. However, in the embodiment shown in FIGS. 4B and 4C, levitation magnets 140 and 144 are south poles, and levitation magnets 142 and 146 are north poles.

Figure 5:
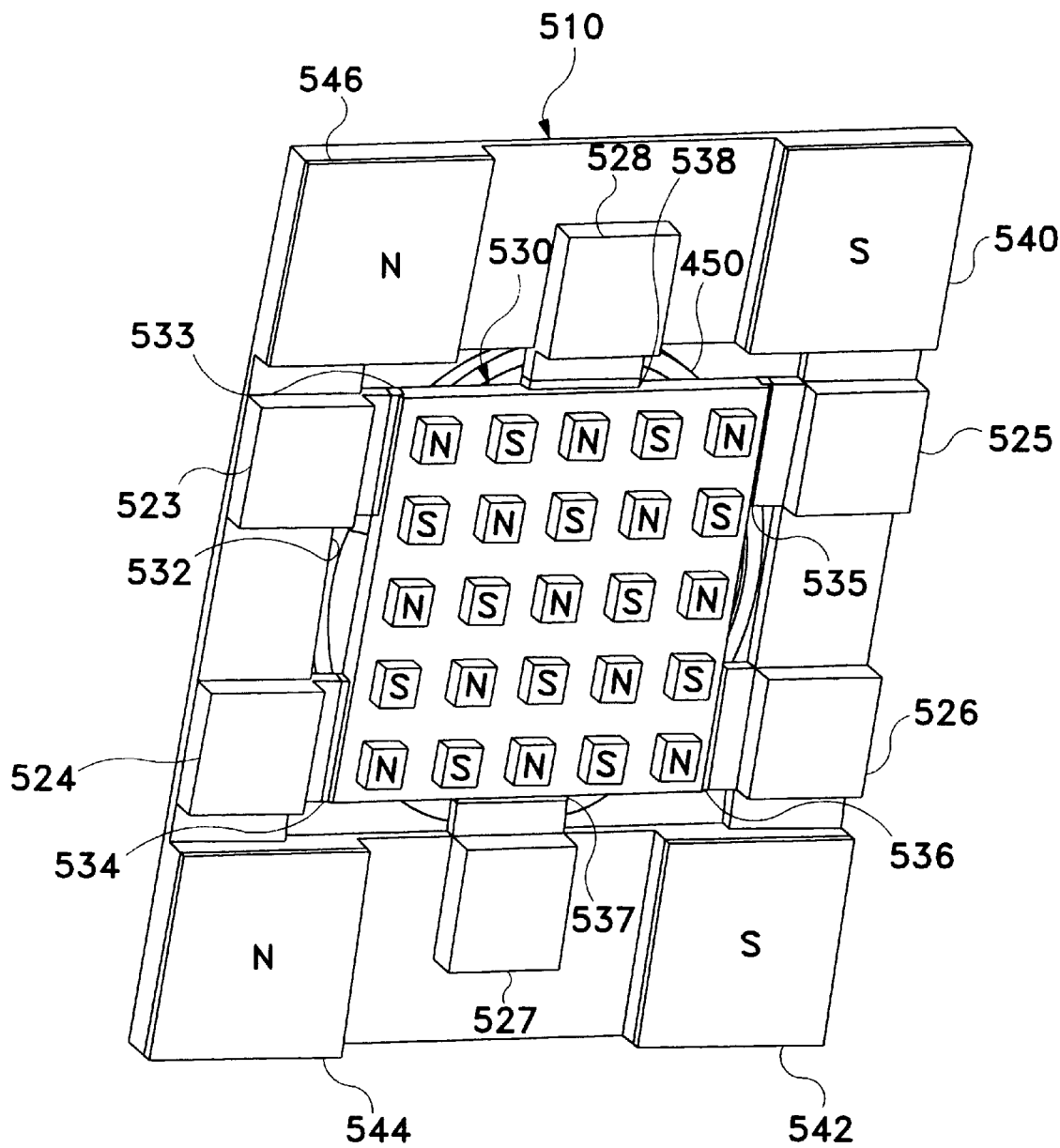
FIG. 5 is a bottom perspective view of a variation of the inner and outer platforms useable in the apparatus of FIG. 1.

FIG. 5 is a bottom perspective view of the work piece 450 attached to a second embodiment of an outer platform 510 and a second embodiment of an inner platform 530. Unlike the levitation magnets 140, 142, 144 and 146 of the inner platform 130, levitation magnets 540, 542, 544, and 546 are attached to a support member of the outer platform 510. Periodically spaced magnets are on the inner platform 530 in the embodiment in FIG. 5. Magnet bearing pieces 523, 524, 525, 526, 527, and 528 are attached to the outer platform 510 and correspond to magnet bearing pieces 123, 124, 125, 126, 127, and 128 of the outer platform 110. Similarly, the inner platform 530 has several magnet bearing pieces 533, 534, 535, 536, 537, and 538. Similar to the embodiment shown in FIGS. 4A–4C, the magnet bearing pieces on the outer platform 510 and inner platform 530 are paired to form magnetic bearings: 523 and 533, 524 and 534, 525 and 535, 526 and 536, 527 and 537, and 528 and 538. The magnet bearing formed by magnetic bearing pieces 527 and 537 oppose the magnetic bearing formed by magnetic bearing pieces 528 and 538. Similarly, the magnetic bearing formed by magnetic bearing pieces 525 and 535 oppose the magnetic bearing formed by magnetic bearing pieces 523 and 533. Further, the magnet bearing formed by magnetic bearing pieces 526 and 536 oppose the magnetic bearing formed by the magnetic bearing pieces 524 and 534. Opposing magnetic bearings suspend the inner platform 530 in an aperture 532 formed by the outer platform 510. The magnetic bearings hold the inner platform 530 in place in the X and Y directions, approximately parallel to surfaces on the inner and outer platforms 510 and 530, but permit motion in directions perpendicular to the X and Y directions.

Figure 6:
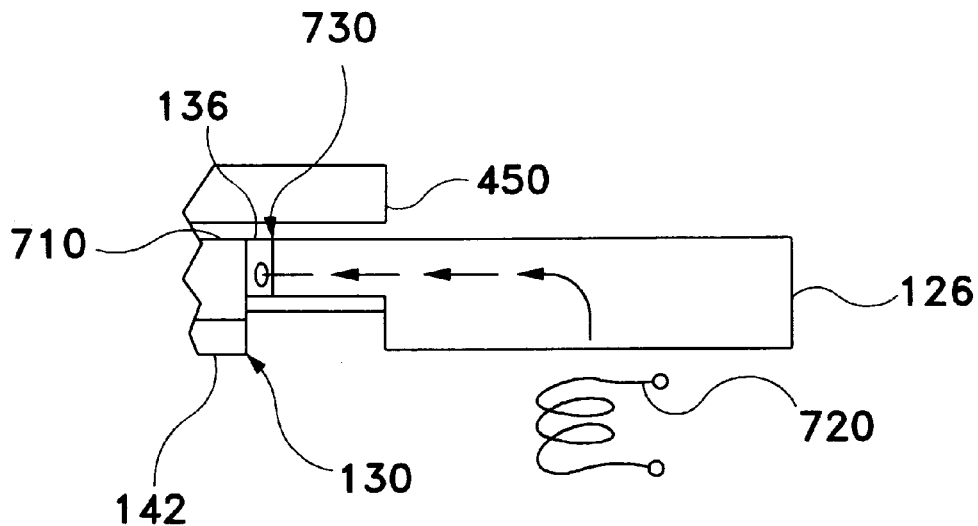
FIGS. 6 and 7 are partial side cut-away view and a top plan view, respectively, of a magnet bearing useable with the inner and outer platforms of FIGS. 4A–4C and 5.

FIG. 6 is a partial side cut-away view of the arrangement in FIGS. 4A–C showing the magnet bearing formed by magnet bearing pieces 126 and 136. As shown, the magnet bearing piece 136 and the levitation magnet 142 are attached to a support member 710 of the inner platform 130. A coil 720 of the coil array is activated by applying an electrical current to the coil 720 to generate a magnetic field in the proximity of the magnet bearing piece 126. Within the magnet bearing piece 126, which may be L-shaped, magnetic flux flows in the direction shown towards the corresponding magnetic bearing piece 136 on the inner platform 130. A gap 730 separates the two magnetic bearing pieces 126 and 136. Although the gap may be of any suitable size to provide the desired amount of stiffness for a particular application, the gap 730 is generally within a range of 20 $\mu$m to 1 mm. The magnetic bearing pieces 126 and 136 are attracted to each other by the magnetic flux.

Figure 7:
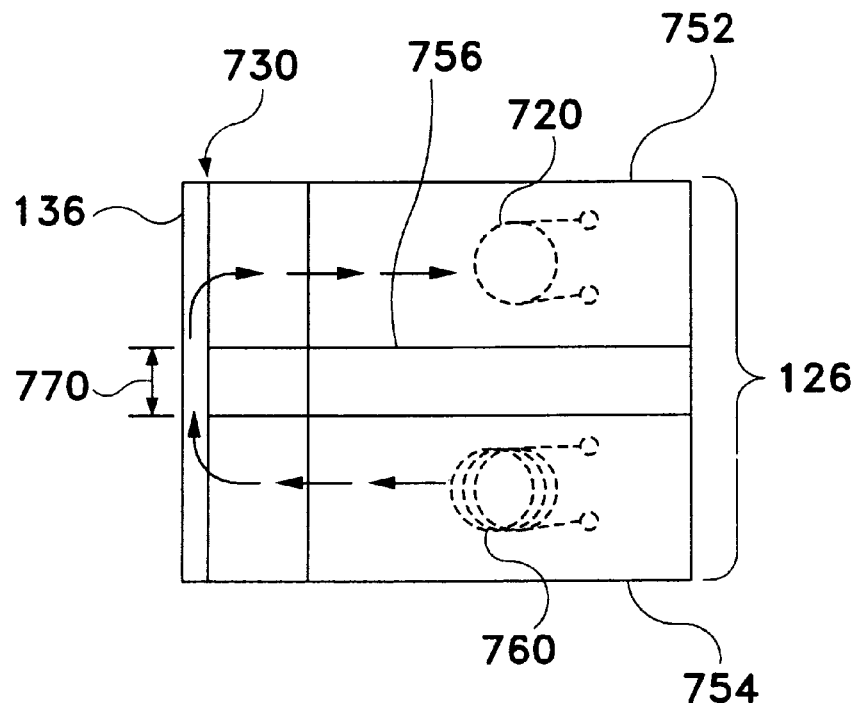

FIG. 7 is a top view of the section of the apparatus shown in FIG. 6 illustrating the magnet bearing formed by magnet bearing pieces 126 and 136. The magnetic bearing piece 126 comprises magnetically permeable pieces 752 and 754 and a magnetically impermeable piece 756 separating the magnetically permeable pieces 752 and 754. Coils 720 and 760, shown in phantom, are disposed below the magnetically permeable pieces 752 and 754, respectively. Where a width 770 of the magnetically impermeable material 756 is larger than the gap 730 between the two magnetic bearing pieces 126 and 136, the magnetic flux generated by the coils 720 and 760 will tend to create a flux path between the magnetically permeable pieces 752 and 754 through the magnet bearing piece 136. The closing of the flux path through the magnetic bearing piece 136 causes the attraction between the magnetic bearing pieces 126 and 136.

The apparatus 100 of the present invention may be used with a lithography system such as shown and described in, for example, U.S. Pat. No. 5,528,118, "Guideless Stage With Isolated Reaction Stage," issued to Lee on Jun. 18, 1996 and U.S. Pat. No. 5,623,853, "Precision Motion Stage with Single Guide Beam and Follower Stage" issued to Novak on Apr. 29, 1997, referenced in the Background section, which are incorporated herein by reference in their entireties.

Figure 8:
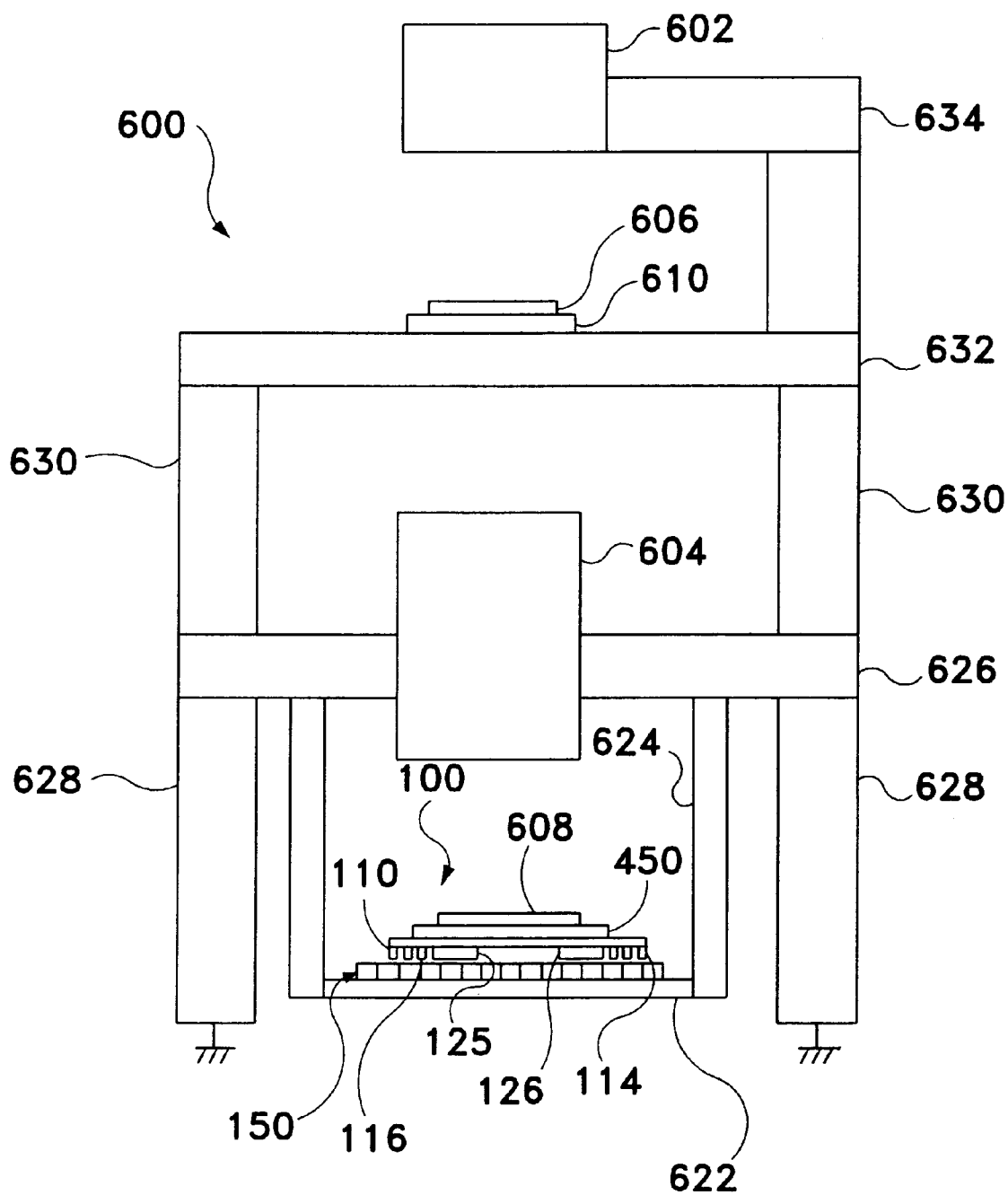
FIG. 8 is a side view of an example of a photolithography system using the apparatus of the present invention.

FIG. 8 shows a side view of an example of a photolithography system 600 using the apparatus 100 of the present invention. The photolithography system 600 generally comprises an illumination system 602 and a wafer support and positioning system 100. The illumination system 602 projects light through a reticle 606 which is supported by and scanned using stage 610. The apparatus 100 described in the embodiment(s) can be additionally or alternatively utilized for driving the stage 610 which supports the reticle 606. The photolithography system 600 exposes a pattern on the reticle 606 onto the wafer 608, while the stage 610 which supports the reticle 606 and the apparatus 100 which supports the wafer 608 move synchronously relative to the lens 604.

The pattern on the reticle 606 is generally a circuit pattern for a semiconductor device. The reticle stage is supported by a frame 632. The light is focused through a lens 604 supported on a body 626 which is in turn connected to the ground through a support 628. The lens 604 is also connected to the illumination system 602 through frames 630, 632, and 634. The light exposes a layer of photoresist on a wafer 608.

The wafer 608 is supported by and scanned using a wafer chuck 450 which is in turn supported and positioned by the apparatus 100 of the present invention. The outer plate 110, magnet bearing pieces 125, 126, magnet array sections 114, 116 and the coil array 150 of the apparatus 100 are shown in FIG. 8. The coil array 150 is supported by backing plate 622. The apparatus 100 of the present invention is connected to body 626 through backing plate 622 and frame 624. It is to be understood that the photolithography system may be different than the one shown herein without departing from the scope of the invention.

Although only a few exemplary embodiments of this invention have been described in detail above, those skilled in the art will readily appreciate that many modifications are possible in the exemplary embodiments without materially departing from the novel teachings and advantages of this invention. For example, although depicted as being planar, the arrays of magnetic poles, coils, and coil assemblies can have either constant or varying curvature in one or two-dimensions as in cylindrical, toroidal, and spherical arrangements of magnetic poles and coil assemblies. For cylindrical arrangements, latitudinal and longitudinal directions may be defined, for example, in standard cylindrical coordinates with corresponding diagonal directions, and parallel arrays and coils lie on parallel surfaces. Additionally, the other embodiments of the inner and outer platforms may have different numbers of magnets than the exemplary embodiments above. Accordingly, all such modifications are intended to be within the scope of the following claims.

What is claimed is:

1. A positioning platform comprising:
   a member having a generally planar surface;
   a plurality of first magnets disposed on said member surface and having a plurality of first magnetic fields generally perpendicular to said member surface, the magnetic field of each magnet being directed in an opposite direction from the magnetic field of an adjacent magnet along at least one direction; and
   a first magnet bearing portion of each of at least one bearing, said first magnet bearing portion being attached to said member and comprising a magnetically permeable material.

2. The platform of claim 1, wherein each of said first magnet bearing portion is adapted to interact with a second magnet bearing portion of each of said at least one bearing to form each bearing to exert forces upon said member.

3. The platform of claim 2, wherein said forces are exerted upon said member in a first direction and in a second direction, the first and the second directions being generally parallel to said planar member surface.

4. The platform of claim 3, wherein said forces exerted on said member approximately comprises of forces only in the first and second directions.

5. The platform of claim 1, wherein said at least one bearing comprises at least two bearings, said bearings being non-colinearly positioned.

6. The platform of claim 5, comprising at least six of said bearings disposed around a periphery of the member, each of said bearings being disposed opposite another of said bearings relative to said member.

7. The platform of claim 1, wherein said first magnet bearing portion comprises two magnetically permeable portions separated by a magnetically impermeable portion.

8. The platform of claim 1, said member defines an aperture therethrough, further comprising:
   a support disposed within said aperture of said member; and
   a second magnet bearing portion of each of said at least one bearing, said second magnet bearing portion being attached to said support, said first and second magnet bearing portions form each of said at least one bearing and interact to exert forces upon said member.

9. The platform of claim 8, wherein said support has a generally planar surface, further comprising a plurality of second magnets disposed on said member surface and having second magnetic fields.

10. The platform of claim 1, further comprising:
    a second member having a generally planar surface and defining an aperture therein, said member is disposed within said aperture; and
    a second magnet bearing portion of each of said at least one bearing, said second magnet bearing portion being attached to said second member, said first and second magnet bearing portions form each of said at least one bearing and interact to exert forces upon said member.

11. The platform of claim 10, further comprising a plurality of second magnets disposed on said second member surface and having second magnetic fields.

12. A planar electric motor comprising:
    a first member defining an aperture therethrough;
    a second member disposed within said aperture and movable relative to said first member within said aperture;
    a plurality of first magnets disposed on a surface of one of said first and second members and having a plurality of first magnetic fields;
    a planar coil array positioned adjacent to the plurality of first magnets and operable to interact with the first magnet fields to provide a force between the coil array and the first magnets in a first and a second direction.

13. The planar electric motor of claim 12, further comprising a first magnet bearing portion on said first member and a second magnet bearing portion on said second member, said first and second magnet bearing portions interact to form a first bearing to couple said second member relative to said first member.

14. The planar electric motor of claim 12, further comprising a plurality of bearings, each bearing comprising a first magnet bearing portion disposed on said first member and a second magnet bearing portion disposed on said second member, said first and second magnet bearing portions of each bearing interact to form said bearing to couple said second member relative to said first member and to allow movement of said second member relative to said first member about the first and second directions and in a third direction generally orthogonal to the first and second directions.

15. The planar electric motor of claim 14, comprising at least six of said bearings disposed around a periphery of the aperture of said first member, each of said bearings being disposed opposite another of said bearings relative to said second member.

16. The planar electric motor of claim 12, wherein the plurality of first magnets are distributed with a first period in the first direction and a second period in the second direction.

17. The planar electric motor of claim 12, wherein said planar coil array comprises a plurality of coils distributed with a first period in the first direction and a second period in the second direction, said first coil period being approximately three-fourths of said first magnet period and said second coil period being approximately three-fourths of said second magnet period.

18. The planar electric motor of claim 12, further comprising a plurality of second magnets having a plurality of second magnetic fields and disposed on a surface of one of said first and second members other than the member having the plurality of first magnets, said planar coil array positioned adjacent to the plurality of second magnets and operable to interact with the second magnetic fields to provide a torque between the coil array and the second magnets about the first and second directions and to provide a force between the coil array and the second magnets in a third direction generally perpendicular to the first and second directions.

19. A lithography system comprising:

an optical system for imaging a pattern onto an article, the optical system comprising a frame;

a member defining an aperture therethrough;

a stage disposed within said aperture for supporting the article relative to the optical system for imaging, said stage being movable relative to said member within said aperture;

at least one bearing coupling said member to said stage and allowing movement of said member relative to said stage;

a plurality of first magnets having a plurality of first magnetic fields and disposed on one of said member and stage; and a planar coil array positioned adjacent to the plurality of first magnets and operable to interact with the first magnet fields to provide a force between the coil array and the first magnets in a first and a second direction, said coil array being attached to the frame.

20. The lithography system of claim 19, wherein said bearing comprises a first magnet bearing portion attached to the stage and a second magnet bearing portion attached to the member, said bearing allows relative movement of the stage and member about the first and second directions and in a third direction generally orthogonal to the first and second directions.

21. The lithography system of claim 20, comprising at least six of said bearings disposed around a periphery of the aperture of the member, each of said bearings being disposed opposite another of said bearings relative to the stage.

22. The lithography system of claim 19, wherein the plurality of first magnets are distributed with a first period in the first direction and a second period in the second direction and the planar coil array comprises a plurality of coils distributed with a first period in the first direction and a second period in the second direction.

23. The lithography system of claim 22, wherein the first coil period is approximately three-fourths of the first magnet period and the second coil period is approximately three-fourths of the second magnet period.

24. The lithography system of claim 19, further comprising a plurality of second magnets having a plurality of second magnetic fields and disposed on one of the stage and member other than the stage or member having the plurality of first magnets, the planar coil array being positioned adjacent to the plurality of second magnets and operable to interact with the second magnetic fields to provide a torque between the coil array and the second magnets about the first and second directions and to provide a force between the coil array and the second magnets in a third direction generally perpendicular to the first and second directions.

* * * * *